(12) United States Patent
Bae et al.

(10) Patent No.: US 11,522,280 B2
(45) Date of Patent: Dec. 6, 2022

(54) DISPLAY DEVICE

(71) Applicant: LG ELECTRONICS INC., Seoul (KR)

(72) Inventors: Joonsub Bae, Seoul (KR); Dongwoo Kim, Seoul (KR); Sangmoon Hwang, Seoul (KR); Yonghan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/225,902

(22) Filed: Apr. 8, 2021

(65) Prior Publication Data

US 2021/0359401 A1 Nov. 18, 2021

(30) Foreign Application Priority Data

May 13, 2020 (WO) ................ PCT/KR2020/006311

(51) Int. Cl.
*H01Q 1/42* (2006.01)
*H01Q 1/12* (2006.01)
(Continued)

(52) U.S. Cl.
CPC ................ *H01Q 1/42* (2013.01); *H01Q 1/12* (2013.01); *H04N 5/64* (2013.01); *H05K 5/0004* (2013.01)

(58) Field of Classification Search
CPC .... H01Q 1/12; H01Q 1/1207; H01Q 1/12258; H01Q 1/12266; H01Q 1/2283;
(Continued)

(56) References Cited

U.S. PATENT DOCUMENTS 7,710,452 B1 * 5/2010 Lindberg ............... H04N 7/188
348/149
10,333,195 B2 * 6/2019 Takahashi ............ H01Q 1/2266
(Continued)

FOREIGN PATENT DOCUMENTS

CN 113728333 A * 11/2021 ....... G06K 19/07775
KR 20130077090 7/2013
(Continued)

OTHER PUBLICATIONS

European Patent Office Application Serial No. 21168321.4, Search Report dated Oct. 5, 2021, 7 pages.
(Continued)

*Primary Examiner* — Jason Crawford
(74) *Attorney, Agent, or Firm* — Lee, Hong, Degerman, Kang & Waimey PC

(57) ABSTRACT

Provided is a display device. The display device includes a main body having a display, an outer box in which a control board configured to control the display is embedded, the outer box being separated from the main body, a first antenna provided in the main body, a second antenna configured to wirelessly communicate with the first antenna, the second antenna being provided in the outer box, an antenna bracket to which the second antenna is coupled, and an antenna mount to which the antenna bracket is coupled, the antenna mount being configured to cover an opening defined in the outer box. The antenna bracket includes an antenna cover configured to cover the second antenna and made of a transparent or translucent plastic material.

10 Claims, 8 Drawing Sheets

(51) Int. Cl.
*H04N 5/64* (2006.01)
*H05K 5/00* (2006.01)

(58) Field of Classification Search
CPC . H01Q 1/24; H01Q 1/241; H01Q 1/42; H04B 17/20; H04B 17/23; H04B 1/005; H04B 1/0064
See application file for complete search history.

(56) References Cited

U.S. PATENT DOCUMENTS

| | | | |
|---|---|---|---|
| 10,651,540 B2 | 5/2020 | Nishikawa et al. | |
| 2007/0096994 A1* | 5/2007 | Kuroyanagi | H04N 5/44 343/702 |
| 2008/0225803 A1* | 9/2008 | Tanaka | H04B 1/202 370/338 |
| 2012/0038539 A1 | 2/2012 | Chang | |
| 2014/0184920 A1* | 7/2014 | Ikeda | H01Q 1/2258 343/872 |
| 2017/0222301 A1 | 8/2017 | Shiu et al. | |
| 2018/0219425 A1* | 8/2018 | Choi | H02J 50/70 |
| 2019/0319367 A1 | 10/2019 | Edwards et al. | |
| 2019/0393593 A1 | 12/2019 | Roh et al. | |
| 2020/0117235 A1* | 4/2020 | McClure | H01Q 1/42 |
| 2020/0293257 A1* | 9/2020 | Lawrence | G06F 3/1431 |
| 2021/0120203 A1* | 4/2021 | Kim | H04N 5/44 |
| 2021/0185744 A1* | 6/2021 | Lee | H04W 76/14 |
| 2021/0359401 A1* | 11/2021 | Bae | H01Q 1/12 |
| 2022/0102874 A1* | 3/2022 | Khripkov | H01Q 9/0435 |

FOREIGN PATENT DOCUMENTS

| | | |
|---|---|---|
| KR | 10-2018-0089763 | 8/2018 |
| KR | 10-2019-0118962 | 10/2019 |
| KR | 10-2067708 | 1/2020 |

OTHER PUBLICATIONS

PCT International Application No. PCT/KR2020/006311, International Search Report dated Feb. 9, 2021, 4 pages.

* cited by examiner

【Figure 1】
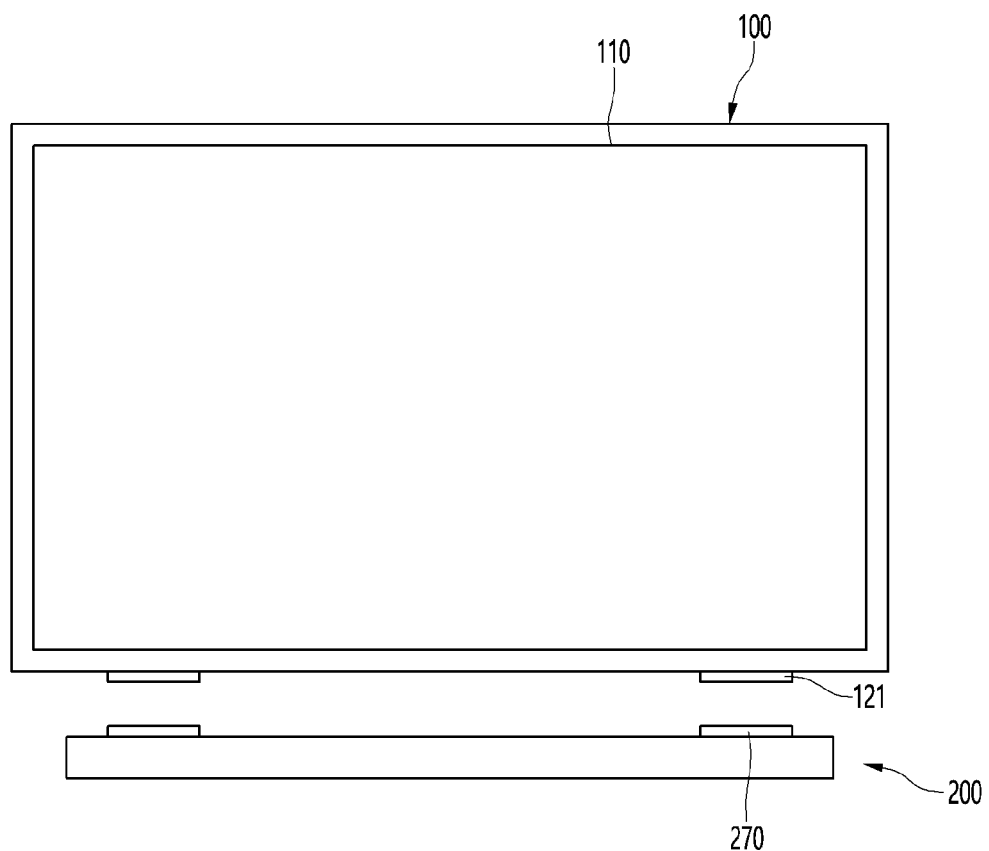

【Figure 2】
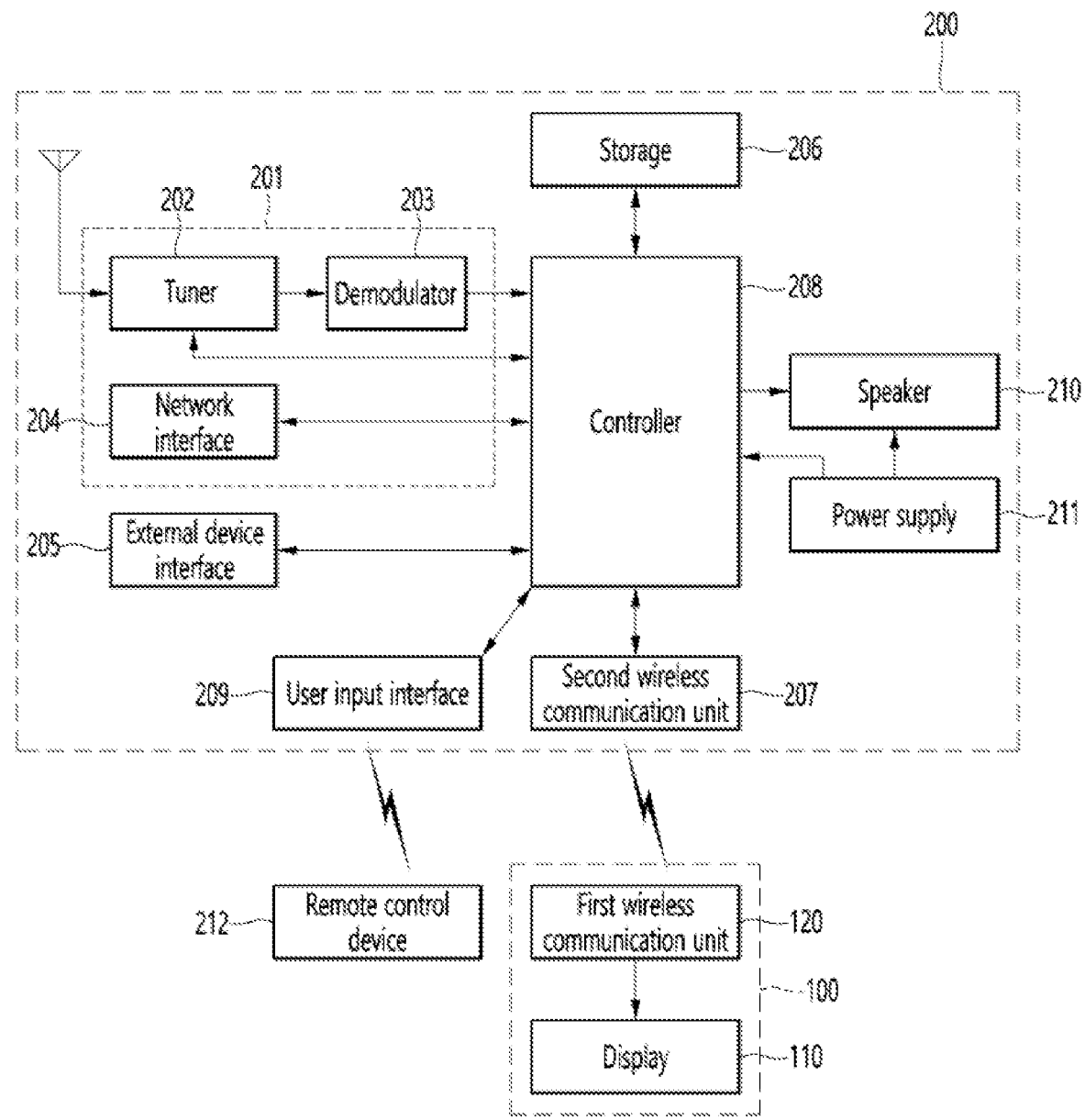

【Figure 3】
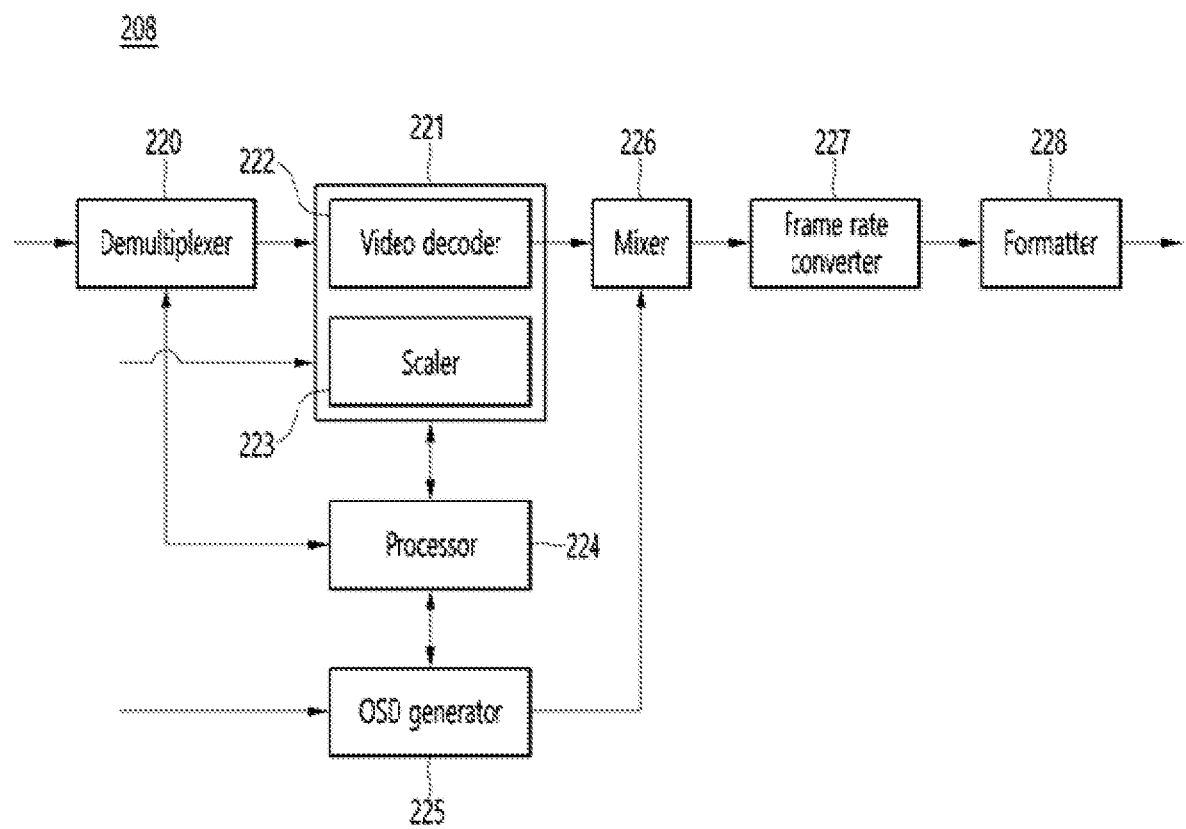

[Figure 4]
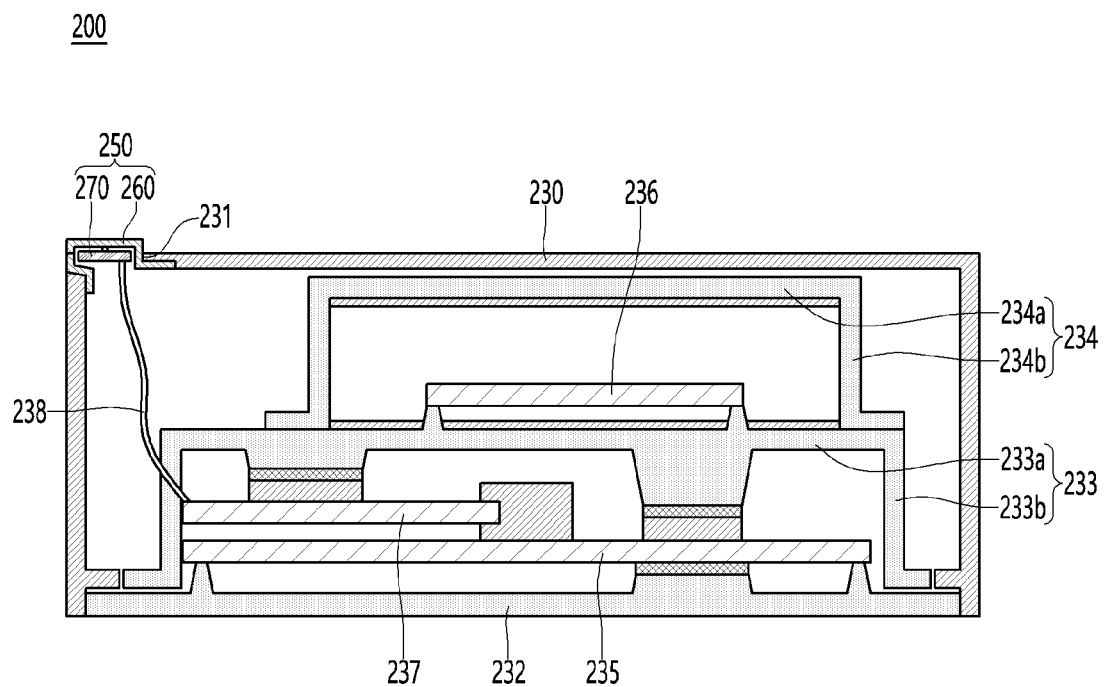

【Figure 5】
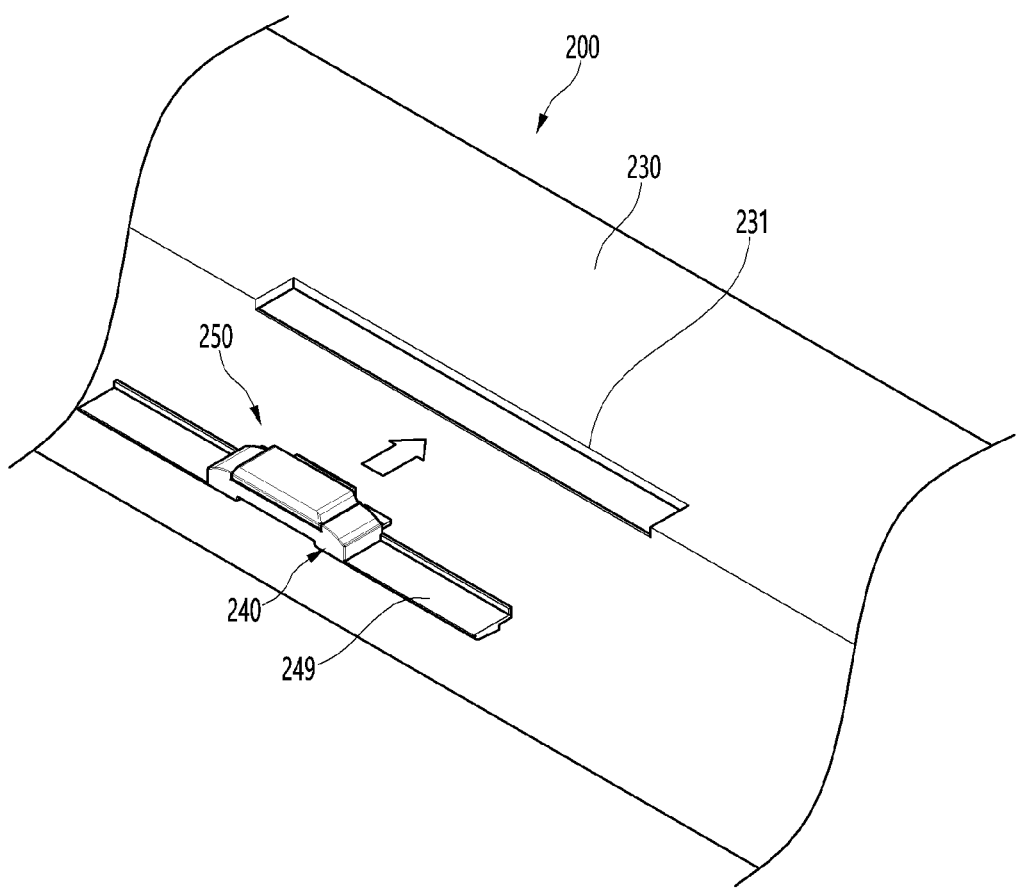

[Figure 6]
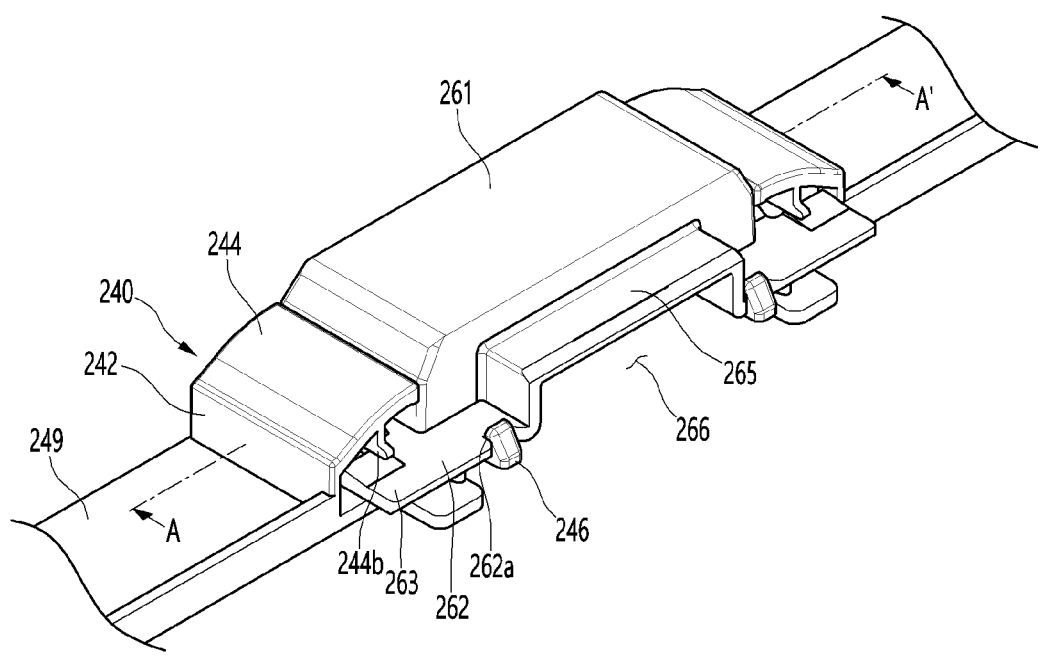

【Figure 7】
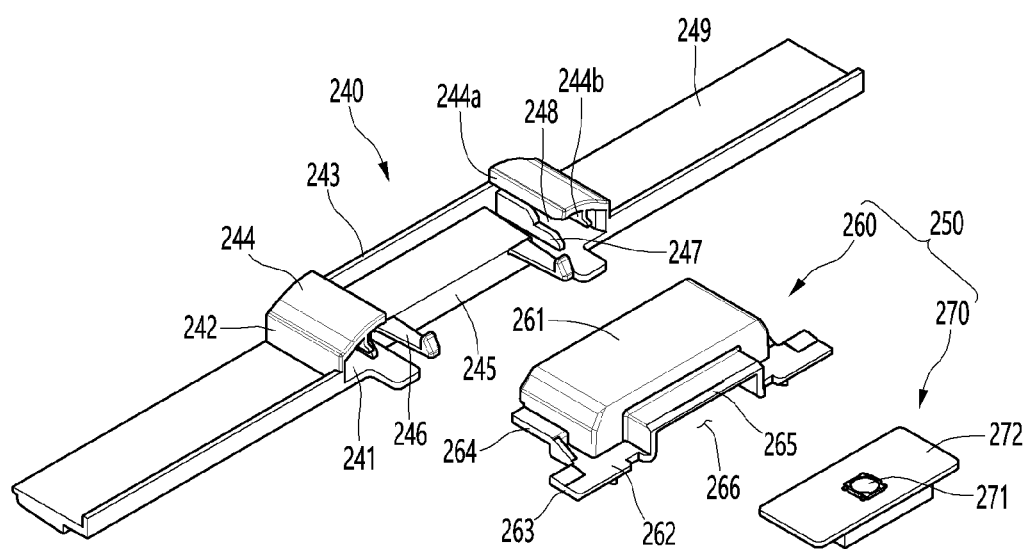

[Figure 8]
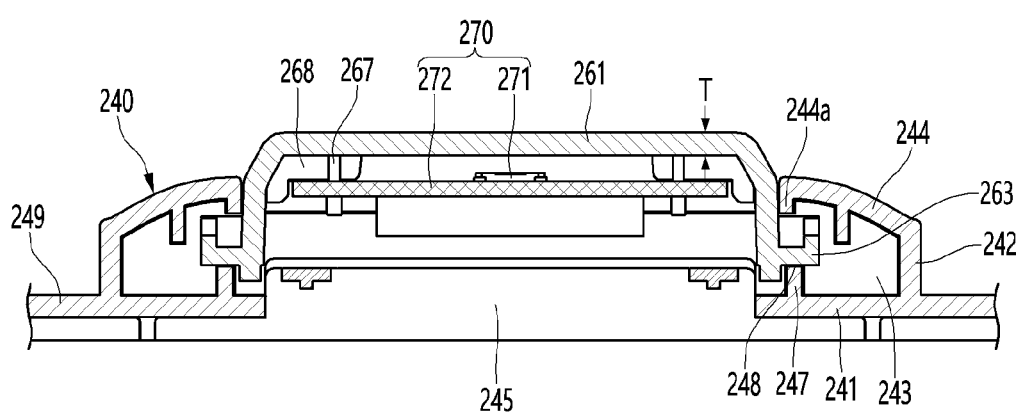

DISPLAY DEVICE

CROSS-REFERENCE TO RELATED APPLICATIONS

Pursuant to 35 U.S.C. § 119 (a), this application claims the benefit of an earlier filing date and right of priority to International Application No. PCT/KR2020/006311 filed on May 13, 2020, the contents of which is hereby incorporated by reference herein in its entirety.

TECHNICAL FIELD

The present disclosure relates to a display device.

BACKGROUND ART

In recent years, the types of display devices have been diversified. Among them, organic light emitting diode displays (hereinafter, referred to as OLED displays) are being widely used.

An OLED display is a display device using an organic light emitting element. Since the organic light emitting element is a self-luminous element, the OLED display device has an advantage in that power consumption is lower than that of a liquid crystal display device, which requires a backlight, and the OLED display device is capable of being manufactured to be thin. In addition, the OLED display device has a wide viewing angle and a fast response speed.

However, in the general display device, since a display panel, a speaker, and an electronic component are mounted in the same housing, there is a limitation in reducing a thickness of the display device.

To solve this limitation, a method of separating a display and an electric part has been invented. However, the above method has a limitation in that the display and the electric part have to be connected to each other in a wired manner to transmit and receive large amounts of data.

DISCLOSURE

Technical Problem

Embodiments provide a display device that is capable of smoothly transmitting and receiving wireless data between a main body and an outer box.

Embodiments also provide a display device having an improved outer appearance.

Technical Solution

In one embodiment, a display device includes: a main body having a display; an outer box in which a control board configured to control the display is embedded, the outer box being separated from the main body; a first antenna provided in the main body; a second antenna configured to wirelessly communicate with the first antenna, the second antenna being provided in the outer box; an antenna bracket to which the second antenna is coupled; and an antenna mount to which the antenna bracket is coupled, the antenna mount being configured to cover an opening defined in the outer box, wherein the antenna bracket includes an antenna cover configured to cover the second antenna and made of a transparent or translucent plastic material.

The antenna cover may have a dielectric constant less than a dielectric constant of the antenna mount.

The antenna cover may be made of polyphenylene ether (PPE) or liquid crystal polymer (LCP).

The antenna bracket may further include a coupling portion connected to the antenna cover and coupled to the antenna mount.

The antenna cover may have a dielectric constant less than a dielectric constant of the coupling portion.

The coupling portion may be made of a polycarbonate material.

The antenna cover may have a thickness corresponding to a multiple of a half-wavelength in the antenna cover of communication radio waves, which are transmitted and received between the first antenna and the second antenna.

The antenna cover may protrude upward from the outer box through the opening.

The antenna bracket may further include a protrusion rib that protrudes from each of both sides of the antenna cover, and a sliding groove into which the protrusion rib may be slid to be inserted is defined in the antenna mount.

Advantageous Effects

According to the embodiment, the control board that controls the display of the main body may be embedded in the outer box separated from the main body. Thus, since the electric components embedded in the main body are minimized, the main body may become slim, and the outer appearance may be improved.

In addition, since the antenna cover is made of the transparent or translucent plastic material, the loss rate of the communication radio waves transmitted and received through the antenna cover may be lowered, and the communication sensitivity may be improved.

In addition, since the antenna module is disposed in the opening of the outer box, the wireless communication between the first antenna of the main body and the second antenna of the outer box may be facilitated. As a result, that high-capacity data may be transmitted and received through the wireless communication to smoothly control the high-definition display.

In addition, the antenna cover may be made of the material having the low dielectric constant, such as polyphenylene (PPE) or liquid crystal polymer (LCP). Therefore, the loss rate of the communication radio waves transmitted and received through the antenna cover may be lowered, and the communication sensitivity may be improved.

In addition, the expensive material having the low dielectric constant may be applied to only the antenna cover, and the other portion of the antenna mount or the antenna bracket may not be made of the above-described material. Therefore, the manufacturing cost may be reduced.

In addition, the thickness of the antenna cover may correspond to the multiple of the half-wavelength in the antenna cover of the communication radio waves. Therefore, the loss rate of the communication radio waves transmitted and received through the antenna cover may be further lowered, and the communication sensitivity may be further improved.

In addition, the antenna cover may protrude upward from the outer box. Therefore, the distance between the first antenna and the second antenna may decrease, and the communication sensitivity may be improved.

In addition, the protruding rib of the antenna bracket may be slid and inserted into the sliding groove of the antenna mount. Therefore, the antenna bracket and the antenna mount may be easily coupled to each other.

DESCRIPTION OF DRAWINGS

FIG. 1 is a front view of a display device according to an embodiment.

FIG. 2 is a control block diagram of the display device according to an embodiment.

FIG. 3 is an internal block diagram illustrating an example of a controller illustrated in FIG. 2.

FIG. 4 is a view illustrating the inside of an outer box according to an embodiment.

FIG. 5 is a view illustrating a state in which an antenna assembly is separated from the outer box according to an embodiment.

FIG. 6 is a perspective view of the antenna assembly according to an embodiment.

FIG. 7 is an exploded perspective view of the antenna assembly illustrated in FIG. 6.

FIG. 8 is a cross-sectional view taken along line A-A' of FIG. 6.

MODE FOR INVENTION

Hereinafter, detailed embodiments will be described in detail with reference to the accompanying drawings.

Hereinafter, when an element is described as being "coupled" or "connected" to another element, it means that the two elements are directly coupled or connected, or a third element exists between the two elements, and the two elements are coupled or connected to each other by the third element. On the other hand, the "direct coupling" or "direct connecting" of one element to the other element may be understood that the third element does not exist between the two elements.

FIG. 1 is a front view of a display device according to an embodiment.

A display device according to an embodiment may include a main body 100 provided with a display 110 and an outer box 200 separated from the main body 100.

The display 110 may be an organic light emitting panel (OLED panel), but is not limited thereto. The main body 100 may be a television, but is not limited thereto.

The outer box 200 may be spaced apart from the main body 100. The outer box 200 may be disposed under the main body 100.

The outer box 200 may wirelessly communicate with the main body 100 to control an image or a picture displayed on the display 110. In more detail, the outer box 200 may include a control board that controls the display 110 of the main body 100. Thus, electric components disposed inside the main body 100 may be minimized, and the main body 100 may be slimmed.

The body 100 may be provided with a first antenna 121, and the outer box 200 may be provided with a second antenna 270. The first antenna 121 and the second antenna 270 may wirelessly communicate with each other.

The first antenna 121 and the second antenna 270 may face each other. Each of the first antenna 121 and the second antenna 270 may be provided in a pair. Thus, communication sensitivity may be improved.

The first antenna 121 may be disposed on an edge of the main body 100. In more detail, the first antenna 121 may be disposed on a lower edge of the body 100. The first antenna 121 may protrude to the outside of the main body 100, but is not limited thereto.

The first antenna 121 may be a transparent antenna.

The second antenna 270 may be disposed adjacent to an outer surface of the outer box 200. In more detail, the second antenna 270 may be disposed adjacent to a top surface of the outer box 200. The second antenna 270 may protrude to the outside of the outer box 200, but is not limited thereto.

The outer box 200 may be referred to as an audio and visual (AV) box. In more detail, a speaker 210 (see FIG. 2) may be provided in the outer box 200. Thus, when compared to a case in which the speaker 210 is provided in the main body 100, a limitation with respect to a location and size of the speaker 210 may be reduced to provide higher quality sound to the user. Also, since the speaker 210 does not need to be embedded in the main body 100, the main body may become slimmer.

FIG. 2 is a control block diagram of the display device according to an embodiment.

The main body 100 may include the display 110 and a first wireless communication unit 120.

The display 110 may respectively convert an image signal, a data signal, and an OSD signal, which are processed by a controller 208 to be described later, or an image signal and a data signal, which are received from an external device interface 205 to be described later, into R, G, and B signals to generate driving signals.

The first wireless communication unit 120 may communicate with the outer box 200 through wireless communication. In more detail, the first wireless communication unit 120 may communicate with a second wireless communication unit 207 to be described later of the outer box 200.

The wireless communication may include short range communication. For this, the first wireless communication unit 120 may support the short range communication by using at least one of Bluetooth™, Bluetooth low energy (BLE), radio frequency Identification (RFID), infrared data association (IrDA), ultra-wideband (UWB), ZigBee, near field communication (NFC), wireless-fidelity (Wi-Fi), Wi-Fi direct, or wireless universal serial bus (Wireless USB).

The first antenna 121 described above may be included in the first wireless communication unit 120. The first wireless communication unit 120 may receive various signals or information related to the control of the display 110 and may transmit the received signals or information to the display 110.

The outer box 200 may include a broadcast receiving unit 201, an external device interface 204, a storage 206, a second wireless communication unit 207, a controller 208, a user input interface 209, and a speaker 210, and a power supply 211.

The broadcast receiving unit 201 may include a tuner 202, a demodulator 203, and a network interface 204.

The tuner 202 may tune a specific broadcast channel according to a channel selection command. The tuner 202 may receive a broadcast signal for the tuned specific broadcast channel.

The demodulator 203 may divide the received broadcast signal into a video signal, an audio signal, and a data signal, which are related to a broadcast program, and may restore the separated video signal, audio signal, and data signal into a form that is capable of being outputted.

The network interface 204 may provide an interface for connecting the display device to a wired/wireless network including an Internet network. The network interface 204 may transmit or receive data to/from other users or other electronic devices through a connected network or another network linked to the connected network.

The network interface 204 may access a predetermined web page through the connected network or another network linked to the connected network. That is, the network interface 204 may transmit or receive data to/from a corresponding server by accessing the predetermined web page through the network.

In addition, the network interface 204 may receive content or data provided by a content provider or a network operator. That is, the network interface 204 may receive contents such as movies, advertisements, games, VODs, broadcast signals, and related information provided from the content provider or the network provider through the network.

Also, the network interface 204 may receive update information and an update file of firmware provided by a network operator and may transmit data to an Internet or content provider or network operator.

The network interface 204 may select and receive a desired application from applications that are opened to the public through the network.

The external device interface 205 may receive an application or an application list in an adjacent external device and transmit the received application or application list to the controller 208 or the storage 206.

The external device interface 205 may provide a connection path between the display device and the external device. The external device interface 205 may receive one or more of video and audio output from an external device that is wirelessly or wiredly connected to the display device to transmit the received video and audio to the controller 208. The external device interface 205 may include a plurality of external input terminals. The plurality of external input terminals may include an RGB terminal, one or more high definition multimedia interface (HDMI) terminals, and a component terminal.

The image signal of the external device input through the external device interface 205 may be output through the display 110. The voice signal of the external device input through the external device interface 205 may be output through the speaker 210.

The external device that is connectible to the external device interface 205 may be any one of a set-top box, a Blu-ray player, a DVD player, a game console, a sound bar, a smartphone, a PC, a USB memory, and a home theater, but this is merely an example.

Also, some content data stored in the display device may be transmitted to another user, which is registered in advance in the display device, a selected user, or a selected electronic device among other electronic devices.

The storage 206 may store a program for processing and controlling each of the signals in the controller 208 and may store the signal-processed video, audio, or data signals.

Also, the storage 206 may perform a function for temporary storage of the video, audio, or data signal input from the external device interface 205 or the network interface 204 and also may store information on a predetermined image through a channel memory function.

The storage 206 may store an application or an application list input from the external device interface 205 or the network interface 204.

The display device may play content files (movie files, still image files, music files, document files, application files, etc.) stored in the storage 206 to provide the images to the user.

The user input interface 209 may transmit a signal input by the user to the controller 208 or may transmit a signal from the controller 208 to the user. For example, the user input interface 209 may receive and process control signals such as power on/off, channel selection, and screen setting from a remote control device 212 or transmit the control signals received from the controller 208 to the remote control device 212 according to various communication methods such as Bluetooth, ultra wideband (WB), ZigBee, radio frequency (RF) communication, or infrared (IR) communication.

Also, the user input interface 209 may transmit control signals input from a local key (not shown) such as a power key, a channel key, a volume key, and a set value to the controller 208.

The image signal processed by the controller 208 may be input to the display 110 and displayed as an image corresponding to the corresponding image signal. Also, the image signal processed by the controller 208 may be input to an external output device through the external device interface 205.

An audio signal processed by the controller 208 may be output as audio to the speaker 210. Also, the audio signal processed by the controller 208 may be input to the external output device through the external device interface 205.

In addition, the controller 208 may control overall operations within the display device.

Also, the controller 208 may control the display device by a user command or an internal program input through the user input interface 209 and may access the network and download the application or application list desired by the user into the display device.

The controller 208 enables channel information selected by the user to be output through the display 110 or the speaker 210 together with the processed image or audio signal.

Also, the controller 208 may output a video signal or an audio signal, which is input through the external device interface 205, from an external device, for example, a camera or a camcorder input through the display 110 or the speaker 210 according to an external device video playback command received through the user input interface 209.

The controller 208 may control the display 110 of the main body 100 to display an image, for example, may control the display 110 of the main body 100 so that a broadcast image input through the tuner 202, an external input image input through the external device interface 205, an image input through the network interface, or an image stored in the storage 206 is displayed on the display 110. In this case, the image displayed on the display 110 may be a still image or a moving image, and also may be a 2D image or a 3D image.

Also, the controller 208 may control contents stored in the display device or received broadcast contents, or external input contents input from the outside to be played, and the contents may have various forms such as a broadcast image, an external input image, an audio file, a still image, a connected web screen, and a document file.

The first wireless communication unit 207 may communicate with the main body 100 through wireless communication. In more detail, the second wireless communication unit 207 may communicate with the first wireless communication unit 120 of the main body 100.

The wireless communication may include short range communication. For this, the second wireless communication unit 207 may support the short range communication by using at least one of Bluetooth™, Bluetooth low energy (BLE), radio frequency Identification (RFID), infrared data association (IrDA), ultra-wideband (UWB), ZigBee, near field communication (NFC), wireless-fidelity (Wi-Fi), Wi-Fi direct, or wireless universal serial bus (Wireless USB).

The second antenna 270 described above may be included in the second wireless communication unit 207. The second wireless communication unit 207 may transmit various signals or information related to the control of the display 110 to the display 110 of the main body 100 through the first wireless communication unit 120. Thus, the controller 208 may control an output of the display 110.

Also, the second wireless communication unit 207 may support wireless communication between the display device and the wireless communication system, between the display device and other display devices, or between the display device and the network, in which the display device 100 (or an external server) is located, through wireless area networks. The wireless area networks may be wireless personal area networks.

Here, the other display device may be a wearable device capable of exchanging (or interlocking with) data with the display device according to the present disclosure, for example, a smartwatch, a smart glass, or a head mounted display (HMD), a mobile terminal such as the smartphone. The second wireless communication unit 207 may detect (or recognize) a wearable device capable of communication around the display device. Furthermore, when the detected wearable device is a device that is authenticated to communicate with the display device according to the present disclosure, the controller 208 may transmit at least portion of data processed by the display device to the wearable device through the second wireless communication unit 207. Thus, a user of the wearable device may use the data processed by the display device through the wearable device.

Since the display device illustrated in FIG. 2 is merely an embodiment, some of the illustrated components may be integrated, added, or omitted according to specifications of the display device that is actually implemented.

That is, two or more constituents may be combined with each other as one constituent, or one constituent may be divided into two or more constituent. Also, functions performed by each block are for describing an embodiment, and specific operations or devices thereof do not limit the scope of the present disclosure.

According to another embodiment, unlike FIG. 2, the display device may not include the tuner 202 and the demodulator 203 and may receive and play back an image through the network interface 204 or the external device interface 205.

For example, the display device may be implemented separately into an image processing device such as a set-top box for receiving broadcast signals or contents according to various network services and a content reproducing device for reproducing contents input from the image processing device.

In this case, the method of operating the display device according to an embodiment to be described below may be performed by any one of not only the display device as described with reference to FIG. 2, but also the image processing device such as the separated set-top box or the content reproducing device including the display 110 and the speaker 210.

The speaker 210 receives a signal processed by the controller 208 to output the received signal as a voice.

The power supply 211 supplies corresponding power to the entire display device. Particularly, power may be supplied to the controller 208 that is capable of being implemented in the form of a system on chip (SOC) and the speaker 210 for the audio output.

Specifically, the power supply 211 may include a converter that converts AC power to DC power and a DC/DC converter that converts a level of the DC power.

The remote control device 212 transmits a user input to the user input interface 209. For this, the remote control device 212 may use Bluetooth, radio frequency (RF) communication, infrared (IR) communication, ultra wideband (UWB), ZigBee, or the like. Also, the remote control device 212 may receive an image, audio, or data signal output from the user input interface 209 to display the image, audio, or data signal on the remote control device 212 or output the image, audio, or data signal as an audio signal.

FIG. 3 is an internal block diagram illustrating an example of the controller illustrated in FIG. 2.

The controller 208 according to an embodiment may include a demultiplexer 220, an image processor 221, a processor 224, an OSD generator 225, a mixer 226, and a frame rate converter 227, and a formatter 228. In addition, the controller 208 may further include an audio processor (not shown) and a data processor (not shown).

The demultiplexer 220 demultiplexes an input stream. For example, when an MPEG-2 TS is input, the MPEG-2 TS may be demultiplexed to be separated into video, audio, and data signals, respectively. Here, the stream signal input to the demultiplexer 220 may be a stream signal output from the tuner 202 or demodulator 203, or the external device interface 205.

The image processor 221 may perform image processing of the demultiplexed image signal. For this, the image processor 221 may include an image decoder 222 and a scaler 223.

The video decoder 222 decodes the demultiplexed video signal, and the scaler 223 performs scaling so that resolution of the decoded video signal is output on the display 110.

The video decoder 222 may include decoders having various standards. For example, the video decoder 222 may include an MPEG-2, an H, 264 decoder, a 3D image decoder for a color image and a depth image, a decoder for a multi-view image, and the like.

The processor 224 may control an overall operation within the display device or the controller 208. For example, the processor 224 may control the tuner 202 to select (tune) RF broadcast corresponding to a channel selected by the user or a pre-stored channel.

Also, the processor 224 may control the display device according to a user command or an internal program input through the user input interface 209.

Also, the processor 224 may perform data transmission control with the network interface 204 or the external device interface 205.

Also, the processor 224 may control operations of the demultiplexer 220, the image processor 221, and the OSD generator 225 in the controller 208.

The OSD generator 225 generates an OSD signal by itself or according to a user input. For example, based on a user input signal, a signal for displaying various types of information as a graphic or text on a screen of the display 110 may be generated. The generated OSD signal may include various data such as a user interface screen of the display device, various menu screens, widgets, and icons. Also, the generated OSD signal may include a 2D object or a 3D object.

Also, the OSD generator 225 may generate a pointer that is capable of being displayed on the display 110 based on a pointing signal input from the remote control device 212.

Particularly, the pointer may be generated by a pointing signal processor, and the OSD generator 225 may include such a pointing signal processor (not shown). Of course, the pointing signal processor (not shown) may be separately provided without being provided in the OSD generator 225.

The mixer 226 may mix the OSD signal generated by the OSD generator 225 with the decoded image signal processed by the image processor 221. The mixed video signal is provided to a frame rate converter 227.

The frame rate converter (FRC) 227 may convert a frame rate of an input image. The frame rate converter 227 may output as it is without additional frame rate conversion.

The formatter 228 may change a format of an input video signal into a video signal for display on the display to output the changed format.

The formatter 228 may change the format of the video signal. For example, the formatter 228 may change a format of a 3D video signal into any one of various 3D formats such as a side by side format, a top/down format, a frame sequential format, an interlaced format, a checker box format, and the like.

The audio processor (not shown) in the controller 208 may perform audio processing of a demultiplexed audio signal. For this, the audio processor (not shown) may include various decoders.

Also, the audio processor (not shown) in the controller 208 may process a base, a treble, a volume control, and the like.

The data processor (not shown) in the controller 208 may perform data processing of a demultiplexed data signal. For example, when the demultiplexed data signal is an encoded data signal, the demultiplexed data signal may be decoded. The encoded data signal may be electronic program guide information including broadcast information such as a start time and an end time of a broadcast program aired on each channel.

The block diagram of the controller 208 illustrated in FIG. 3 is a block diagram according to an embodiment. Each component of the block diagram may be integrated, added, or omitted according to the specifications of the controller 208 that is actually implemented.

Particularly, the frame rate converter 227 and the formatter 228 may be separately provided without being provided in the controller 208 or may be separately provided as one module.

FIG. 4 is a view illustrating the inside of the outer box according to an embodiment, and the outer box 200 includes a case 230, a base plate 232, a first inner frame 233, and a second inner frame 234.

The case 230 may define an outer appearance of the outer box 200. The case 230 has an inner space and an opened bottom surface. The housing 230 may have a box shape having an opened bottom surface.

The base plate 232 may cover the opened bottom surface of the case 230. The base plate 232 may be horizontally disposed. The base plate 232 may define the outer appearance of the outer box 200 together with the case 230.

A first substrate 235 may be disposed above the base plate 232. That is, the first substrate 235 may be disposed inside the case 230.

The first substrate 235 may be a control board that controls the display 110 of the main body 100. That is, the first substrate 235 may be included in the controller 208 described above.

The first inner frame 233 may be disposed inside the case 230. The first inner frame 233 may cover the first substrate 235 and may be supported by the base plate 232.

In more detail, the first inner frame 233 may include a first cover plate 233a spaced upward from the base plate 232 and a first support 233b bent or extending downward from an edge of the first cover plate 233a and connected to a top surface of the base plate 232.

The first substrate 235 may be disposed vertically between the base plate 232 and the first cover plate 233a. The first substrate 235 may be disposed inside the first support 233b.

A second substrate 236 may be disposed above the first inner frame 233. That is, the second substrate 236 may be disposed inside the case 230.

The second substrate 236 may be a power board. That is, the second substrate 236 may be included in the power supply 211 described above.

The second inner frame 234 may be disposed inside the case 230. The second inner frame 234 may cover the second substrate 236 and may be supported by the first inner frame 232.

In more detail, the second inner frame 234 may include a second cover plate 234a spaced upward from the first cover plate 233a and a second support 233b bent or extending downward from an edge of the second cover plate 234a and connected to a top surface of the first cover plate 233a.

The second substrate 236 may be disposed vertically between the first cover plate 233a and the second cover plate 233b. The second substrate 236 may be disposed inside the second support 234b.

A size of the second inner frame 234 may be less than that of the first inner frame 233. In more detail, an area of the second cover plate 234a may be less than that of the first cover plate 233a.

The communication board 237 may be electrically connected to the second antenna 270. The communication substrate 237 may be included in the second communication unit 207 (see FIG. 2) described above.

The communication board 237 may be disposed inside the case 230. The communication substrate 237 may be disposed inside the first inner frame 233. That is, the communication substrate 237 may be covered by the first inner frame 233 together with the first substrate 235.

The communication substrate 237 may be connected to the first substrate 235. The communication substrate 237 may be disposed above the first substrate 235.

The communication board 237 may be connected to the second antenna 270 in a wired manner. A wire 238 connecting the communication board 237 to the second antenna 270 may bypass the second inner frame 234 or pass through the second inner frame 234.

The second antenna 270 may be disposed outside the first inner frame 233 and the second inner frame 234.

The second antenna 270 may be mounted on the outer box 200 while being coupled to an antenna bracket 260. The second antenna 270 and the antenna bracket 260 may be referred to as an antenna module 250. That is, the antenna module 250 may include the second antenna 270 and the antenna bracket 260.

In more detail, an opening 231 may be defined in the outer box 200, and the antenna module 250 may be disposed in the opening 231. The opening 231 may allow the inside and the outside of the case 230 to communicate with each other. The opening 231 may be defined in a top surface of the case 230, and more particularly, an edge of the top surface of the case 230. Hereinafter, a case in which the opening 231 is defined in a rear edge of the top surface of the case 230 will be described as an example.

The antenna module 250 may protrude upward through the opening 231. Since the antenna module 250 is disposed in the opening 231, communication radio waves transmitted and received between the second antenna 270 and the first antenna 121 (see FIG. 1) may not be disturbed by the case 230. Thus, communication sensitivity between the first antenna 121 and the second antenna 270 may be improved.

FIG. 5 is a view illustrating a state in which an antenna assembly is separated from the outer box according to an embodiment.

The antenna module 250 may be mounted on the outer box 200 while being coupled to the antenna mount 240. In more detail, the antenna mount 240 may be detachably mounted on the opening 231 of the outer box 200 while the antenna bracket 260 is coupled.

The antenna module 250 and the antenna mount 240 may be referred to as an antenna assembly. That is, the antenna assembly may include the antenna module 250 and the antenna mount 240.

An expansion portion 249 covering the opening 231 may be disposed on the antenna mount 240. The expansion portion 249 may be horizontally expanded from the antenna mount 240. The expansion portion 249 may be horizontally expanded to both sides of the antenna mount 240. The antenna mount 240 and the expansion portion 249 may cover the opening 231 of the outer box 200 together.

FIG. 6 is a perspective view of the antenna assembly according to an embodiment, and FIG. 7 is an exploded perspective view of the antenna assembly illustrated in FIG. 6.

As described above, the antenna module 250 may include the second antenna 270 and the antenna bracket 260.

The second antenna 270 may include an antenna body 271 and a substrate 272 on which the antenna body 271 is mounted.

The antenna bracket 260 may include an antenna cover 261 covering the second antenna 270.

The antenna cover 261 may cover the second antenna 270 at an upper side. The antenna cover 261 may have an inner space in which the second antenna 270 is accommodated. A bottom surface of the antenna cover 261 may be opened.

The second antenna 270 may be fixed inside the antenna cover 261. In more detail, a plurality of fixing protrusions 267 protruding inward may be disposed on the antenna cover 261. Each of the fixing protrusions 267 may protrude downward from the inner top surface of the antenna cover 261.

The fixing protrusion 267 may pass through the substrate 272 of the second antenna 270 to fix the second antenna 270.

An inner rib 268 may be disposed on the antenna cover 261 to separate the second antenna 270 from an inner surface of the antenna cover 261. The inner rib 268 may protrude from the inner surface of the antenna cover 261 and may be in contact with the substrate 272 of the second antenna 270.

The antenna cover 261 may be made of a transparent or translucent plastic material. The antenna cover 261 may have a sufficiently low dielectric constant. The dielectric constant of the antenna cover 261 may be lower than that of each of the outer box 200 and the antenna mount 250.

Thus, a loss of radio waves passing through the antenna cover 261 may be minimized. That is, sensitivity of communication radio waves transmitted and received between the first antenna 121 (see FIG. 1) and the second antenna 270 may be improved.

As an example, the antenna cover 261 may be made of a material of polyphenylene ether (PPE) or liquid crystal polymer (LCP). Since the materials are expensive materials, only the antenna cover 261 may contain the materials, and other portions of the antenna bracket 260, i.e., a coupling portion 262 or a protruding rib 264, which will be described later, may not content the materials so as to reduce manufacturing cost. That is, the dielectric constant of the antenna cover 261 may be lower than that of each of the coupling portion 262 or the protruding rib 264. For example, each of the coupling portion 262 and the protruding rib 264 may be made of a polycarbonate material.

However, the embodiment is not limited thereto. For example, the antenna bracket 260 may be integrally made of polyphenylene ether (PPE) or liquid crystal polymer (LCP).

A thickness T of the antenna cover 261 may correspond to a multiple of a half-wavelength in the antenna cover 261 of the communication radio waves. Since the half-wavelength is determined according to the material of the antenna cover 261, the thickness T of the antenna cover 261 may vary depending on the material of the antenna cover 261.

The thickness T of the antenna cover 261 may mean a thickness of a portion facing the second antenna 270, that is, a portion through which the communication radio waves transmitted and received from the second antenna 270 pass.

In more detail, the thickness T of the antenna cover 261 may be a multiple of a unit thickness t according to the following equation.

$$t = \frac{c}{2f\sqrt{\varepsilon r}} = \frac{\lambda}{2}$$

In the above equation, 'c' represents a speed of light, 'f' represents a frequency of communication radio waves transmitted and received between the first and second antennas 121 and 270, '$\varepsilon r$' represents a dielectric constant according to the material of the antenna cover 261, and '$\lambda$' represents a wavelength of the communication radio waves.

Thus, transmittance of the communication radio waves to the antenna cover 261 may increase, and a loss rate may further decrease.

The antenna bracket 260 may include a coupling portion 262 coupled to the antenna mount 240.

The coupling portion 262 may be connected to the antenna cover 261. The coupling portion 262 may have a plate shape extending horizontally from a lower end of the antenna cover 261. The coupling portion 262 may extend forward from a front lower end of the antenna cover 261. The coupling portion 262 may be provided in a pair, which are spaced apart from each other in a horizontal direction.

The coupling portion 262 may be coupled to a latch 246 of the antenna mount 240. A latch groove 262a through which the latch 246 of the antenna mount 240 is hooked may be defined in a front end of the coupling portion 262.

An expansion portion 263 extending laterally may be disposed on the coupling portion 262. The pair of expansion parts 263 may extend in opposite directions from each of the coupling parts 262.

Each of the expansion parts 263 may be in contact with an upper rib 244b to be described later of the antenna mount 240. The upper rib 244b may be in contact with the expansion portion 263 at an upper side of the expansion portion 263. Thus, the antenna bracket 260 coupled to the antenna mount 240 may be prevented from being shaken upward with respect to the antenna mount 240.

The antenna bracket 260 may include a connection rib 265 connecting the pair of coupling parts 262 to each other. The connection rib 265 may protrude forward from the antenna cover 261.

The connection rib 265 may be stepped upward with respect to the coupling portion 262, and both ends of the connection rib 265 may extend downward to be connected to the coupling portion 262.

A passage 266 communicating with the inner space of the antenna cover 261 may be provided inside the connection rib 265. The passage 266 may be opened to front and rear sides and a downward side. The wire 238 (see FIG. 4) in the outer box 200 may be easily connected to the second antenna 270 through the passage 266.

The connection rib 265 may be disposed in the outer box 200 together with the coupling portion 262, and the expansion portion 263 and may not be exposed to the outside.

The antenna bracket 260 may include the protruding rib 264. The protruding rib 264 may protrude from the antenna cover 261 to each of both sides.

The protruding rib 264 may include a first rib connected to the coupling portion 262 or the expansion portion 263 and a second rib stepped upward from the first rib. The second rib may be disposed behind the first rib.

The protruding rib 264 may be slid into a sliding groove 248 to be described later of the antenna mount 240. That is, the protruding rib 264 may be inserted into the sliding groove 248 so that the antenna bracket 260 is mounted on the antenna mount 240. The protruding rib 264 may be inserted into the sliding groove 248 until the latch 246 is coupled to the coupling portion 262.

The antenna mount 240 may include a pair of bases 241 spaced apart from each other in the horizontal direction, a pair of side portions 242 protruding upward from the base 241, a pair of restriction portion 244 extending inward to restrict the antenna bracket 260 in the horizontal direction, a connection portion 245 connecting the pair of bases 241 to each other, and a latch 245 protruding from the connection portion 245.

The base 241 may be horizontal. The base 241 may be disposed inside the expansion portion 249. In the panel that is disposed horizontally, a potion disposed inside the side portion 242 may be the base 241, and a portion disposed outside the side portion 242 may be the expansion portion 249.

A lower rib 247 protruding upward may be disposed on the base 241. The lower rib 247 may be disposed between the side portion 242 and the connection portion 245 to be described later. The lower rib 247 may extend forward and backward.

The lower rib 247 may be in contact with a bottom surface of the protruding rib 264 of the antenna bracket 260.

The side portion 242 may extend upward from an outer end of the base 241. The side portion 242 may define an outer appearance of a side surface of the antenna mount 240.

The side portion 242 may have a vertical plate shape. The pair of side portions 242 may be disposed to face each other with the antenna bracket 260 therebetween.

The restriction portion 244 may extend toward the antenna bracket 260 from an upper end of the side portion 242. The restriction portion 244 may be disposed to be inclined or rounded so that a height increases toward the inside, but is not limited thereto.

The pair of restriction portions 244 may be in contact with both sides of the antenna cover 261, respectively. Thus, the antenna cover 261 may be restricted between the pair of restriction portions 244.

In more detail, a contact portion 244a that is in contact with the side surface of the antenna cover may be disposed on an end of the restriction portion 244. The contact portion 244a may be bent or extend downward from the end of the restriction portion 244. Therefore, when compared to a case in which the contact portion 244a is not provided, a contact area for the antenna cover 261 may increase. Thus, the antenna cover 261 may be more firmly restricted.

The antenna cover 261 may protrude upward from the restriction portion 244. However, the embodiment is not limited thereto, and the top surface of the antenna cover 261 and an upper end of the restriction portion 244 may be disposed at the same height without being stepped.

The restriction portion 244 may be disposed above the base 241. A sliding groove 248 may be defined between the restriction portion 244 and the base 241. In more detail, the sliding groove 248 may be defined between the lower rib 247 and the contact portion 244a. The protruding rib 264 of the antenna bracket 260 may be slid between the sliding groove 248, that is, the lower rib 247 and the contact portion 244a.

An upper rib 244b protruding downward may be disposed on the restriction portion 244. The upper rib 244 may be disposed between the side portion 242 and the contact portion 244a along the extending direction of the restriction portion 244. The upper rib 244b may extend forward and backward.

The upper rib 244 may be in contact with a top surface of the expansion portion 263 of the antenna bracket 260.

A width of each of the side portion 242 and the restriction portion 244 in a front and rear direction may be the same as or similar to a width of the antenna cover 261 in the front and rear direction.

A space that is opened forward and inward may be defined between the base 241, the side portion 242, and the restriction portion 244. The cover portion 243 may cover the space at the rear side.

The cover portion 243 may have a vertical plate shape. The cover portion 243 may extend horizontally. The cover portion 243 may protrude upward from the connection portion 245 to be described later.

The cover 243 may be in contact with a portion of the lower edge of the antenna cover 261 to prevent the inner space of the antenna cover 261 from being exposed to the outside.

The connection portion 245 may be disposed between the pair of bases 241. The connection portion 245 may protrude upward from each of the pair of bases 241.

The connection portion 245 may be disposed under the second antenna 270 and the antenna cover 261.

A width of the connecting portion 245 in the front and rear direction may be less than a width of each of the base 241, the side portion 242, and the restriction portion 244 in the front and rear direction. The connection portion 245 may be disposed eccentrically backward between the pair of bases 241. The connection portion 245 may protrude forward from the cover portion 243.

The latch 246 may protrude forward from the connection portion 245. The latch 246 may be provided in a pair, which are spaced apart from each other in the horizontal direction.

Each latch 246 may be coupled under the coupling portion 262 of the antenna bracket 260. In more detail, a hook may be disposed on an end of each latch 246, and the hook may be hooked in the latch groove 262a defined in the coupling portion 262.

Hereinafter, a method of mounting the second antenna 270 in the outer box 200 will be described.

The second antenna 270 may be coupled to the inside of the antenna cover 261 of the antenna bracket 260. The antenna bracket 260 to which the second antenna 270 is coupled may be coupled to the antenna mount 240.

In more detail, the protruding rib 264 of the antenna bracket 260 may be inserted to be slid into the sliding groove 248 of the antenna mount 240. Here, the antenna cover 260 may be inserted between the pair of restriction portions 244. The antenna bracket 260 may be inserted until the latch 246 of the antenna mount 240 is coupled to the latch groove 262a of the antenna bracket 260.

Thereafter, the antenna mount 240 to which the antenna bracket 260 is coupled may be coupled to the opening 231 (see FIG. 5) of the outer box 200. Thus, the second antenna 270 may be provided in the outer box 200.

The above-disclosed subject matter is to be considered illustrative, and not restrictive, and the appended claims are intended to cover all such modifications, enhancements, and other embodiments, which fall within the true spirit and scope of the present invention.

Thus, the embodiment of the present invention is to be considered illustrative, and not restrictive, and the technical spirit of the present invention is not limited to the foregoing embodiment.

Therefore, the scope of the present invention is defined not by the detailed description of the invention but by the appended claims, and all differences within the scope will be construed as being included in the present invention.

The invention claimed is:

1. A display device comprising:
a main body having a display;
an outer box in which a control board configured to control the display is embedded, the outer box being separated from the main body;
a first antenna provided in the main body;
a second antenna configured to wirelessly communicate with the first antenna, the second antenna being provided in the outer box;
an antenna bracket to which the second antenna is coupled; and
an antenna mount to which the antenna bracket is coupled, the antenna mount being configured to cover an opening defined in the outer box,
wherein the antenna bracket comprises an antenna cover configured to cover the second antenna and made of a transparent or translucent plastic material,
wherein the antenna mount comprises a pair of restriction portions inwardly extended to restrict the antenna bracket in a horizontal direction,
wherein the pair of restriction portions are in contact with both sides of the antenna cover,
wherein the antenna cover is restricted between the pair of restriction portions.

2. The display device according to claim 1, wherein the antenna cover has a dielectric constant less than a dielectric constant of the antenna mount.

3. The display device according to claim 1, wherein the antenna cover is made of polyphenylene ether (PPE) or liquid crystal polymer (LCP).

4. The display device according to claim 1, wherein the antenna bracket further comprises a coupling portion connected to the antenna cover and coupled to the antenna mount.

5. The display device according to claim 4, wherein the antenna cover has a dielectric constant less than a dielectric constant of the coupling portion.

6. The display device according to claim 4, wherein the coupling portion is made of a polycarbonate material.

7. The display device according to claim 1, wherein the antenna cover has a thickness corresponding to a multiple of a half-wavelength in the antenna cover of communication radio waves, which are transmitted and received between the first antenna and the second antenna.

8. The display device according to claim 1, wherein a thickness of the antenna cover is a multiple of a unit thickness according to following equation;

$$t = \frac{c}{2f\sqrt{\varepsilon r}}$$

where,
t: unit thickness
c: speed of light
f: frequency of communication radio waves transmitted and received between first and second antennas
εr: dielectric constant according to material of the antenna cover.

9. The display device according to claim 1, wherein the antenna cover protrudes upward from the outer box through the opening.

10. A display device comprising:
a main body having a display;
an outer box in which a control board configured to control the display is embedded, the outer box being separated from the main body;
a first antenna provided in the main body;
a second antenna configured to wirelessly communicate with the first antenna, the second antenna being provided in the outer box;
an antenna bracket to which the second antenna is coupled; and
an antenna mount to which the antenna bracket is coupled, the antenna mount being configured to cover an opening defined in the outer box,
wherein the antenna bracket comprises an antenna cover configured to cover the second antenna and made of a transparent or translucent plastic material,
wherein the antenna bracket further comprises a protrusion rib that protrudes from both sides of the antenna cover, and
wherein the antenna mount has a sliding groove for receiving a portion of the protrusion rib.

* * * * *